United States Patent [19]
Lesk

[11] 3,996,094
[45] Dec. 7, 1976

[54] SILICON MANUFACTURE

[75] Inventor: I. Arnold Lesk, Scottsdale, Ariz.

[73] Assignee: Motorola, Inc., Chicago, Ill.

[22] Filed: Jan. 2, 1975

[21] Appl. No.: 537,981

[52] U.S. Cl. .............................. 156/608; 156/620; 427/82

[51] Int. Cl.$^2$ ..................... B01J 17/18; B01J 17/08

[58] Field of Search .......................... 156/617–620, 156/608; 427/82

[56] References Cited
UNITED STATES PATENTS

| | | | |
|---|---|---|---|
| 3,096,158 | 7/1963 | Gaule et al. | 156/618 |
| 3,351,433 | 11/1967 | Keller | 156/617 |
| 3,413,098 | 11/1968 | Dermatis | 156/619 |
| 3,701,636 | 10/1972 | Labelle et al. | 156/619 |

*Primary Examiner*—Michael F. Esposito
*Attorney, Agent, or Firm*—Henry T. Olsen; Harry M. Weiss

[57] ABSTRACT

A method of producing monocrystalline semiconductor material in web form which provides the steps of providing a web of polycrystalline semiconductor material having a width which is much greater than its thickness, providing a monocrystalline semiconductor material seed having the same relative dimensions as the polycrystalline material source, providing one or more semiconductor material shaping members, contacting the source, the seed and the shaping member and heating the interface therebetween preferentially to produce a molten zone, moving said monocrystalline semiconductor material seed away from said molten zone as monocrystalline semiconductor material is formed thereon.

3 Claims, 8 Drawing Figures

SILICON MANUFACTURE

Related Application

This application is related to S.N. 537,976 filed Jan. 2, 1975, entitled "Silicon Manufacture".

BACKGROUND OF THE INVENTION

This invention relates to the manufacture of monocrystalline webs of semiconductor material and, more particularly, to a method of manufacture of monocrystalline webs of silicon.

One of the most common methods for pulling single crystal semiconductor material is the Czochralski method wherein a monocrystalline rod is pulled from a melt of the semiconductor material. The monocrystalline rod must then be sawed, lapped and polished into suitable wafers for the production of semiconductor devices. Another method of producing monocrystalline semiconductor material is a "float zone" technique, wherein a monocrystalline rod is pulled from a melt within, or on top of, an ingot of polycrystalline material. Again, this technique produces a monocrystalline rod which must be sawed, lapped and polished to produce wafers suitable for semiconductor production.

It has previously been recognized that large savings of material could be made if the monocrystalline semiconductor material could be produced directly in ribbons or strips that approximated at least one dimension of the semiconductor device to be processed. However, problems with control of the molten region, the thermal profile, both vertical and horizontal, and growth rate, have prevented various suggested ways of doing this from attaining commercial acceptability.

With the present need for new energy sources, many suggestions have revolved around the use of solar energy. One way solar energy can be utilized is with solar cells, whereby the radiant solar energy is converted directly to electrical energy. Systems using solar cells will require large amounts of semiconductor material, particularly silicon, if such systems are to become acceptable. Such silicon must be attainable at a cost far less than present costs for transistors, rectifiers, etc.

SUMMARY OF THE INVENTION

It is an object of this invention to provide an improved method for the manufacture of webs of moncrystalline semiconductor material.

It is an object of the present invention to void the undesirable shortcomings of the prior art, by providing a simple method in relatively inexpensive apparatus for producing uniform webs of monocrystalline semiconductor material.

A further object of the invention is to provide a method for rapidly and reliably growing thin webs of monocrystalline semiconductor material.

In accordance with these objects, there is provided a method of producing moncrystalline semiconductor material in web form which provides the steps of providing a web of polycrystalline semiconductor material having a width which is much greater than its thickness, providing a monocrystalline semiconductor material seed having the same relative dimensions as the polycrystalline material source, providing a semiconductor material shaping member, contacting the source, the seed and the shaping member and heating the interface therebetween preferentially to produce a molten zone, and moving said moncrystalline semiconductor material seed away from said molten zone as monocrystalline semiconductor material is formed thereon.

THE DRAWINGS

Further objects and advantages of the invention will be understood from the following complete description thereof and from the drawings wherein.

COMPLETE DESCRIPTION

Figure 1:
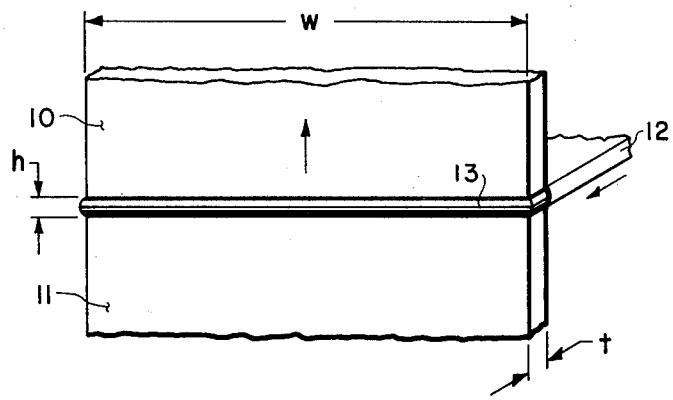
FIG. 1 is a perspective view of the inter-relationship of the source and shaping members in accordance with the invention.

As illustrated in FIG. 1, a monocrystalline web 10 is produced from a polycrystalline web 11 by contacting the monocrystalline web and the polycrystalline web with a stationary shaping member 12 and then forming a thin molten region 13 between the three members. The stationary shaping member 12 is preferably of monocrystalline semiconductor material of the same type as the polycrystalline material, preferably silicon.

The stationary support member provides two basic functions to the operation in accordance with the method by first supporting the molten zone in a controlled fashion and secondly by operating as a heat sink to remove excess heat from the molten zone and thus maintain the molten zone small and properly shaped.

Many of the problems encountered by prior attempts to form monocrystalline semiconductor material ribbons are related to the need to control the shape of the liquid interface with the monocrystalline material being pulled. Due to the effects of gravity and surface tension on the liquid, close control of the heating elements, shaping of the web while in liquid form and rapid cooling of the molten zone monocrystalline interface have been required.

To alleviate these problems, in accordance with the invention, the polycrystalline web which is to be converted to the monocrystalline web, is of approximately the same dimensions as the monocrystalline web to be formed to provide a readily controllable process. The web has a large surface area and the molten zone therebetween is kept extremely small. This eliminates the realtively large total amount of heat in the system required by the prior art methods. To attain this large surface area with a small amount of heat, the width of the web, $w$, is at least 100 times the thickness, $t$, and the height, $h$, of the molten region is no greater than the thickness of the web, so that the amount of molten material and, hence, the heat is kept very low. An example of such a web is width of 3 inches, a thickness of 20 mils and height equal to or less than 20 mils. This greatly reduces the problem of fluid flow of the molten material and the problems related to surface tension and the effects of gravity. Also, since the molten zone is small and, hence, contains only a limited amount of heat, provision for rapid cooling is done primarily by the large surface area of the web being formed. This greatly increases the speed of operation of the method relative to the prior art and leads to a very economical process.

Figure 2:
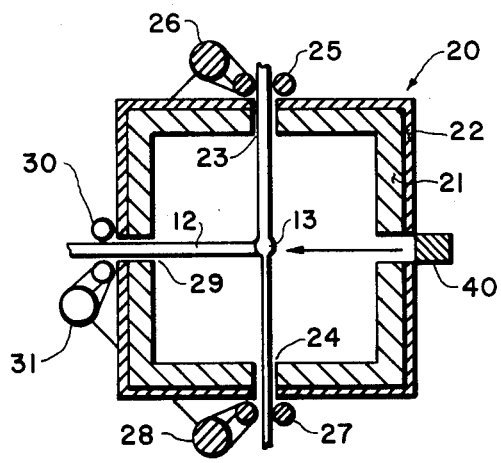
FIGS. 2 and 3 are cross-sections of a simplified apparatus for carrying out the method.
Figure 3:
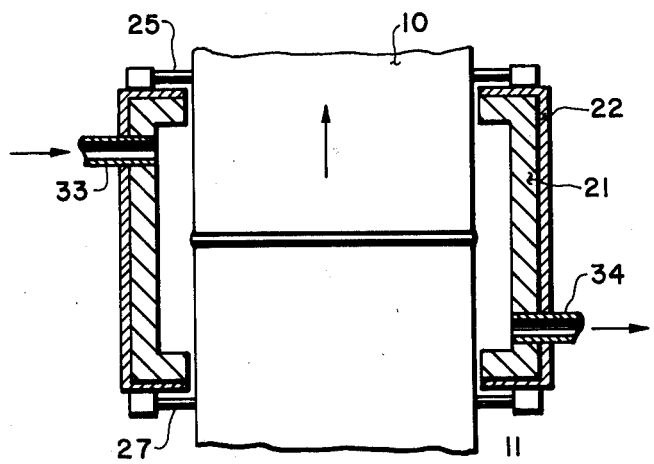

Apparatus for carrying out the process as depicted in FIGS. 2 and 3 and comprises a chamber 20 having an inner lining 21 of quartz and an outer shell 22 of suitable structural material such as steel. Since the amount of heat energy is small, a simple glass or plastic chamber is utilizable. Slots 23 and 24, having a dimension only slightly larger than the web 10 to be formed, the polycrystalline material source web 11, and the shaping member web 12, are provided in one end and side of the chamber to provide egress and exit for the polycrystalline web 11 and the monocrystalline web 10, respectively.

A pair of rolls 25 driven by a motor 26 provided immediately adjacent to slot 23 on the exterior of the chamber to pull the monocrystalline web 10 from the chamber and a pair of rolls 27 driven by a motor 28 is provided adjacent slot 24 to push the polycrystalline web 11 into the chamber. Both motor 26 and 28 are adjustable to provide appropriate input and output movement rates of the source and product webs. The stationary support member 12 is positioned adjacent the side opposite the slot 23 and is provided for adjustment of the height and volume of the molten zone 13. To this end the relatively stationary member 12 is inserted into the chamber through a slot 29 and supported by a pair of rolls 30 which may be controlled by an adjust motor 31 to control the position of the upper end of the support member 12.

Energy means 40 is provided at the side of the chamber opposite to the egress slot 29 to direct a focused band of energy toward the junction between the webs to form molten zone 13. This radiant energy source is preferably a laser beam but might be focused radiant energy, radiant energy from a nearby heated filament or otherwise, as shall be explained in detail hereinafter.

An inert gas flow is maintained through the chamber 20 through an inlet 33 and outlet 34 the inlet gas pressure being greater than the outlets so that inert gas flows out slots 23 and 24 and 29 while thus protecting the web from the atmosphere. The inert gas flow also removes some of the heat from the system. Since the effect of gravity is greatly reduced by the small volume of molten material, the orientation of the chamber, that is, whether it is considered vertical or horizontal, is immaterial.

Figure 4:
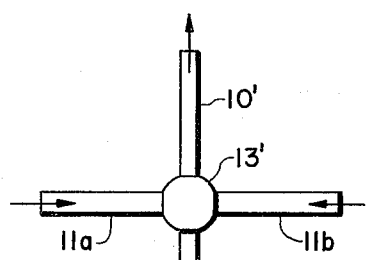
FIGS. 4–8 illustrate further embodiments of the invention.
Figure 5:
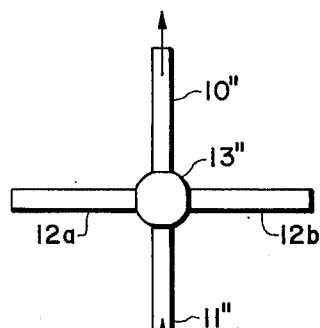

A further embodiment of the invention is diagrammatically depicted in FIG. 4 wherein the monocrystalline web 10' is withdrawn from a molten zone 13' produced above a monocrystalline semiconductor material stationary member 12'. The molten zone may be fed by a pair of polycrystalline material webs 11a and 11b to produce the molten zone. In a like fashion in a further embodiment of the invention shown in FIG. 5 the monocrystalline web 10'' may be fed by a polycrystalline semiconductor material web 11'' which is fed to a molten zone 13'' produced between a pair of spaced monocrystalline members 12a and 12b.

Figure 6:
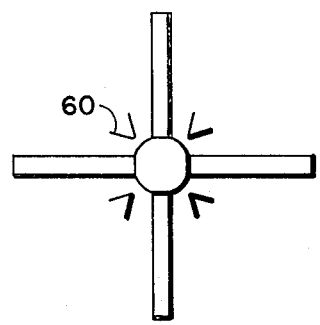
Figure 8:
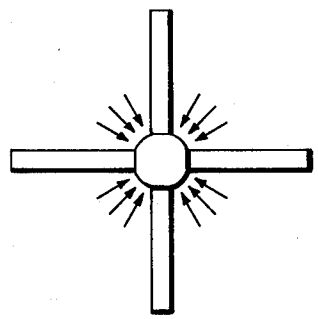
Figure 7:
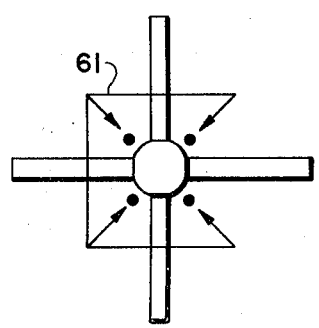

The heating required to produce the molten zone between the members may be produced by shaped electrically conductive heater member 60, preferably of tungsten, as depicted in FIG. 6 or by heated conductive wires 61 as depicted in FIG. 7. Also as shown in FIG. 8 the focused radiant energy, for example from a laser source, may be directed from multidirections at the central molten zone as shown in FIG. 8.

It will thus be seen that there is provided a method for rapidly producing a monocrystalline web of semiconductor material, having a dimension similar to that of the source material, rapidly and efficiently. While the source material has been referred to herein as polycrystalline material, it will be understood that, as used herein, the polycrystalline material could be monocrystalline material having defects which require further refinement.

While the invention has been described by way of a preferred embodiment thereof, it will be appreciated that certain modifications may be made therein without departing from the spirit and scope of the invention.

What is claimed is:

1. A method of producing monocrystalline semiconductor material in web form which comprises the steps of:

providing a web of polycrystalline semiconductor material having a width which is much greater than its thickness, said web corresponding substantially in shape to that desired for the monocrystalline material;

providing a monocrystalline semiconductor material seed having relatively the same dimensions as the polycrystalline source;

providing a semiconductor material shaping member, said shaping member and said web being made of the same semiconductor material;

contacting the source, the seed and shaping member;

heating the interface therebetween preferentially to produce a molten zone having a thickness no greater than that of said web; and moving said monocrystalline semiconductor material seed away from said molten zone as monocrystalline semiconductor material is formed thereon.

2. A method as recited in claim 1 wherein said semiconductor material is silicon.

3. A method as recited in claim 1 and further including the step of providing a web of polycrystalline semiconductor material having the same relative dimension as the first polycrystalline material source and feeding said second web to said molten zone from a direction opposite to that at which the first web is moved.

* * * * *